United States Patent [19]
Irvine

[11] Patent Number: 5,952,632
[45] Date of Patent: *Sep. 14, 1999

[54] CPU SET-UP KEY FOR CONTROLLING MULTIPLE CIRCUITS

[75] Inventor: James A. Irvine, Beaverton, Oreg.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/671,623

[22] Filed: Jun. 28, 1996

[51] Int. Cl.⁶ .................................................. H01H 27/00
[52] U.S. Cl. ...................... 200/16 E; 200/43.06; 200/46; 439/189
[58] Field of Search .................................. 200/46, 61.19, 200/506, 16 B, 16 E, 1 R, 42.01–43.07; 439/55–75, 630–640, 677–681, 189; 364/709.01, 709.16; 174/262–266; 361/631, 632, 633, 637–640, 657, 171

[56] References Cited

U.S. PATENT DOCUMENTS

| | | | |
|---|---|---|---|
| 2,929,042 | 3/1960 | Guttridge et al. | 174/262 X |
| 3,348,102 | 10/1967 | Bosland et al. | 361/632 |
| 3,476,890 | 11/1969 | Powell | 200/61.19 X |
| 3,651,464 | 3/1972 | Hedin et al. | 361/172 |
| 3,710,303 | 1/1973 | Gallager, Jr. | 439/637 X |
| 3,793,957 | 2/1974 | Stout et al. | 174/268 |
| 3,957,334 | 5/1976 | Pass et al. | 200/46 |
| 3,963,301 | 6/1976 | Stark | 439/680 |
| 4,017,135 | 4/1977 | Taguchi | 439/62 |
| 4,166,667 | 9/1979 | Griffin | 439/637 |
| 4,327,955 | 5/1982 | Minter | 439/635 X |
| 4,429,201 | 1/1984 | Dekkers et al. | 200/506 |
| 4,695,926 | 9/1987 | McDermott | 361/736 |
| 4,857,001 | 8/1989 | Nakano et al. | 439/68 |
| 5,308,249 | 5/1994 | Renn et al. | 439/637 X |
| 5,425,649 | 6/1995 | Reymond | 439/189 |
| 5,442,243 | 8/1995 | Bailey | 307/10.5 |
| 5,612,634 | 3/1997 | MacKenna | 326/62 |

*Primary Examiner*—J. R. Scott
*Attorney, Agent, or Firm*—Blakely, Sokoloff, Taylor & Zafman

[57] ABSTRACT

A key activated switch matrix on a mother board that enables a dedicated key when inserted to select a subset of selectable parameters and thereby configure the mother board without further operator intervention. A housing having a slot is positioned on the mother board. An array of conductor pairs is positioned in the slot one element of each pair on either side of the slot with one end of each element of a conductor pair extending through the bottom of the housing to make electrical contact with wiring of the mother board and the other end of each element formed so as to make contact with its mating conductor element. A key is provided that consists of a single electrically insulating body having dimensions for fitting into the slot between the pairs of conductor elements and allowing certain of the conductor pairs to make electrical contact and precluding other pairs from making contact.

18 Claims, 3 Drawing Sheets

CPU SET-UP KEY FOR CONTROLLING MULTIPLE CIRCUITS

BACKGROUND OF THE INVENTION

1. Field of the Invention

The present invention relates to the set-up of computer system mother boards to accommodate different configurations of components. More particularly, it relates to a key activated switch matrix on a mother board that enables a dedicated key when inserted to select a subset of selectable parameters and thereby configure the mother board without further operator intervention.

2. Description of the Prior Art

Personal computer architectures are organized around one or more system busses to which are connected a CPU, high speed system memory, a display, high capacity memory and a host of peripheral devices such as printers, modems, sound cards, CDROMs and the like. The system busses along with the CPU and system memory and some peripheral devices are usually mounted on a system printed circuit board, often called a mother board.

The components mounted on the mother board come in many varieties. For example, a typical CPU may be labeled at the factory as operating at 120 megahertz, but this same CPU can be operated in a system at several other frequencies such as 100, 90, 75 and even 150 megahertz. Typically, the frequencies at which a system operates are determined by a single quartz controlled clock mounted on the mother board which provides the clock signals for the system busses and all components of the computer system.

To keep the costs of computer systems low, there are only a few mother board designs and each design supports a wide variety of computer system configurations. For in addition to computer speeds, there are several bus speeds and several CPU core voltages that must be accommodated. In order to do this efficiently, mother board designers have developed single board designs that can be switched between several different configurations. For example, a single mother board design can support a CPU with speeds of 120, 90 and 75 megahertz and with CPU core voltage levels of 5, 3.54, 3.36 and 2.5 volts. This means that for each mother board, their is a set of selectable parameters. The mother board designs contain a matrix of individual switches that are set by hand to select a specific subset of parameters from the set of selectable parameters.

In the prior art, the switches are either dip switches or suit case jumpers. In either case a technician must set each individual switch, one at a time. And often the number of switches to be set is quite large. Usually, the technician will use a switch map to guide them in the setting process.

There are two problems with the foregoing process. First, many mistakes are made. The technician must be precisely correct in order for the configuration to be right. This is difficult to do when dealing with very large numbers of mother boards. Also, configurations are often changed during the manufacturing and test process. For example, the automatic test equipment that tests the CPU after it has been mounted on a mother board typically perform their tests at one frequency, say 90 megahertz. Thus, all switches would be set for 90 megahertz operation for test purposes. However, after the test is complete the mother board would have its configuration switches reset for the shippable configuration. In this process many mistakes are made.

Secondly, with conventional dip switches or suit case jumpers, any person can, with modest computer skills, reset the configuration switches and thereby reconfigure their computer. This creates a host of problems for computer system manufacturers. For example, an end user could reconfigure a mother board to run a CPU designed to run at 90 megahertz at 120 megahertz. The system would probably run; however, the life expectancy of the CPU would go down substantially and would therefore increase the service expenses of the manufacturer.

SUMMARY OF THE INVENTION

The present invention is key activated array of switches that control a set of selectable parameters of a mother board. The array of switches consists of an array of conductor element pairs and a key. The conductor element pairs are positioned such that the key may be inserted between each of the pair of conductor elements in the array. The key is adapted to electrically connect a predetermined pattern of the conductor element pairs and to electrically isolate the conductor elements in all other conductor element pairs when the key is inserted.

BRIEF DESCRIPTION OF THE DRAWING

The preferred embodiments will now be described in conjunction with the Drawing, wherein.

DESCRIPTION OF THE PREFERRED EMBODIMENT

Figure 1:
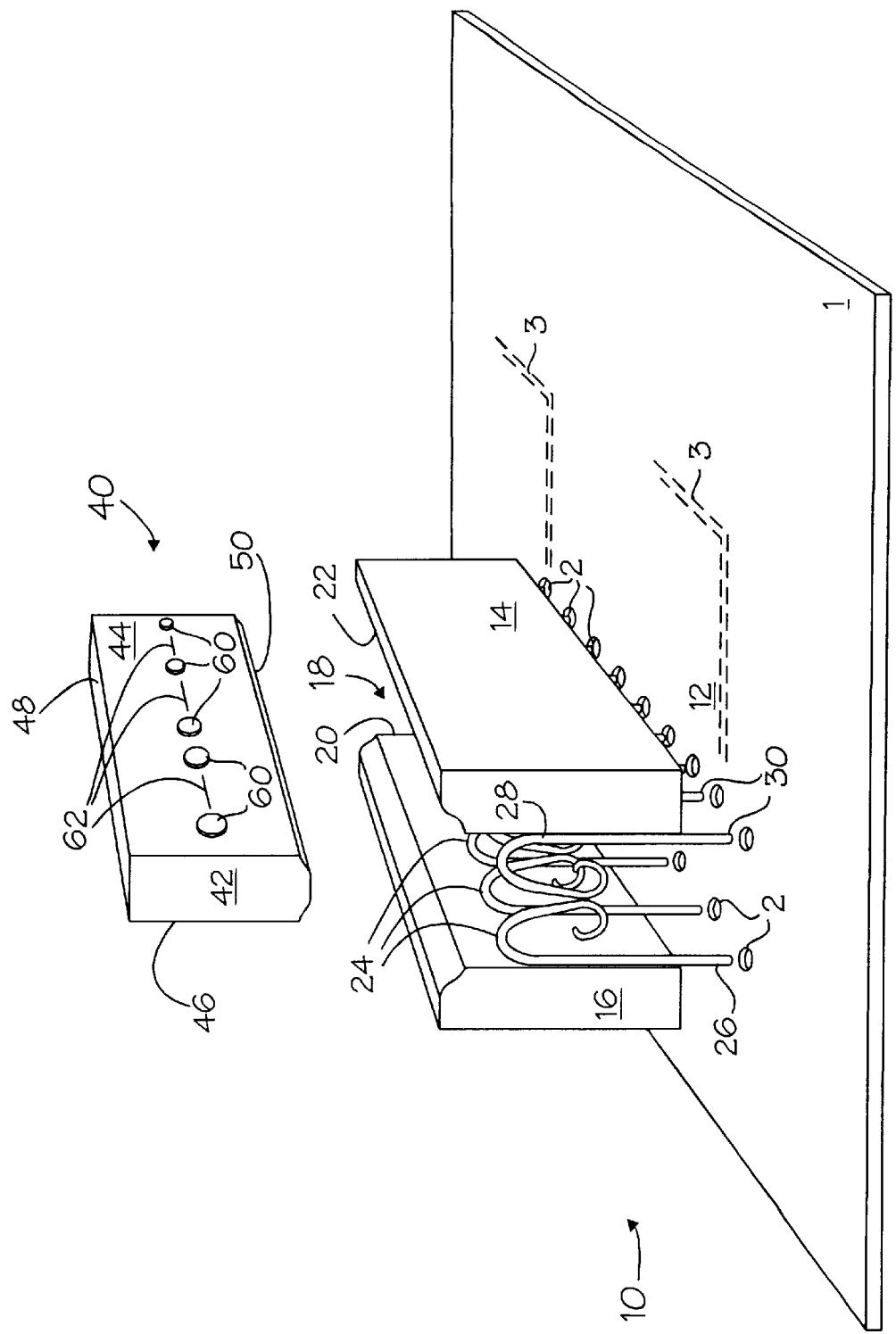
FIG. 1 is a is a partially exploded perspective view of a housing containing conductor pairs.

FIG. 1 is a partially exploded perspective view of a housing containing conductor pairs mounted on a mother board. Referring now to FIG. 1, a rectangular shaped housing 10 has a bottom surface 12 and external longitudinal surfaces 14 and 16. Housing 10 is in position to be mounted on mother board 1. A housing material that normally covers the housing 10 is cut away. A slot 18 runs longitudinally down the middle of housing 10 and is defined by two inner longitudinal surfaces 20 and 22 of the housing 10. A first linear array of conductor elements 24 are positioned along inner surface 20 and have an ends 26 that are in the form of pins extending through bottom 12 to make contact with conductors in mother board 1. The top portion of conductor elements 24 is bent through a 180 degree angle towards the middle of slot 18. A second linear array of conductor elements 28 is positioned along inner surface 22 and has an end 30 that is in the form of pins extending through bottom 12 to make contact with conductors in mother board 1. The top portion of conductor elements 28 are also bent through a 180 degree angle towards the middle of slot 18. Conductor element arrays 24 and 28 are positioned along their respective surfaces such that each conductor element in one array is directly across slot 18 from a corresponding conductor element in the other array. The two conductor elements, one from each array, that face each other are a conductor element pair that form two terminals of a switch. The two arrays of conductor elements 24 and 28 form a single array of conductor element pairs. As mentioned previously, mother board 1 has the ability to switch between several different sets of parameters such as CPU core voltage and clock speeds. As is well known, the mother board design feature that makes this possible consists of printed circuit board wiring in and/or on the mother board forming a plurality of circuits which are capable of being switched in the sense that hard wired electrical connections between various parts of the circuitry are either open or closes. Contact between conductive elements 24 and 28 are made by insertion of pins 26 into receptacle array 2 where they electrically contact printed circuit wiring 3. Printed circuit wiring 3 may be located on inner layers of mother board 1, may be on the surface of mother board 1 or a combination thereof. When the conductor elements of a pair are electrically connected, a circuit on the mother board is closed, and when the conductor elements are not electrically connected, the same circuit on the mother board is open. Thus, the two arrays of conductor elements form a single array of switches. In the embodiment shown in FIG. 1, housing 10 is preferably injection molded from an electrically insulating organic material and pins 24 and 28 are made from an electrically conduction metal that is also spring compliant.

A key 40 has a body 42 with longitudinal surfaces 44 and 46, a top surface 48 and a beveled bottom surface 50. The dimensions of body 42 are such that it may be inserted into slot 18 between conductor element array 24 and conductor element array 28. Body 42 is made from an electrically insulating material, preferably an injection molded organic material. An array of connector elements 60 are contained in body 42. Connector elements 60 are electrically conductive and pass from surface 44 through body 42 to surface 46. Connector elements 60 are located geometrically on surfaces 44 and 46 such that they make contact with the conductor elements of arrays 24 and 28 when key 40 is fully inserted into slot 18. When such contact is made, a switch consisting of a conductor element pair (one conductor from array 24 and one conductor from array 28) and the connector element is closed. However, the user may control which switches are closed and which remain open by omitting connector elements in locations of key 40 where an open switch is desired. For example, in FIG. 1, connector elements are shown to be missing in the locations indicated by reference numeral 62. In those areas where connector elements do not exist, body 42 electrically insulates the two conductor elements of a pair.

Figure 2:
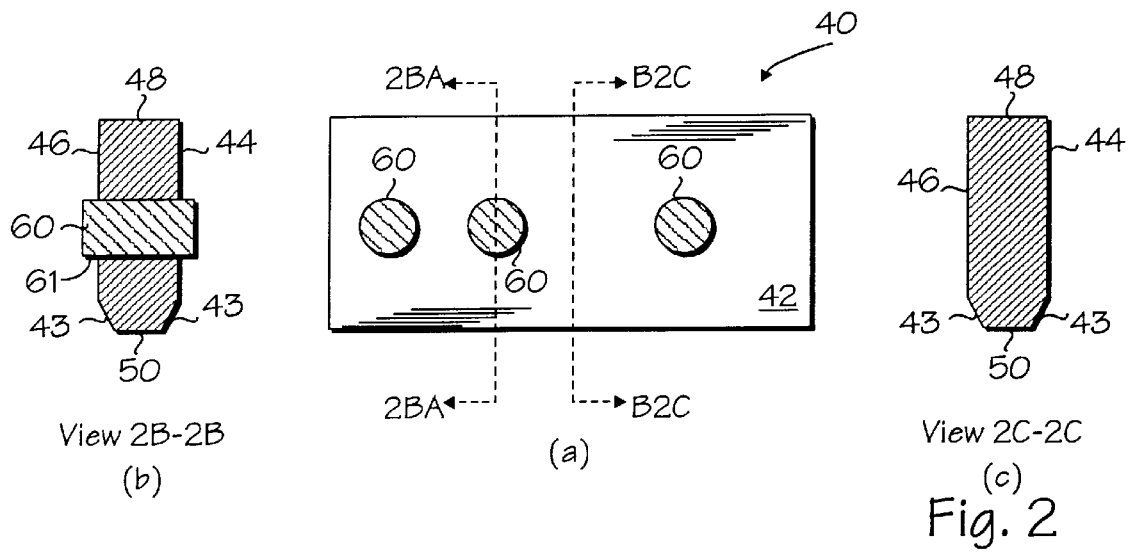
FIG. 2(a) is a front view of a key showing connector elements that pass through the key.
FIG. 2(b) is a cross sectional view of the key of FIG. 2(a) through plane 2B—2B.
FIG. 2(c) is a cross sectional view of the key of FIG. 2(a) through plane 2C—2C.

FIG. 2(a) is a front view of key 40 which illustrates connector element 60 in more detail and FIG. 2(b) is a cross section through body 42 at plane 2B—2B. Referring now to FIGS. 2(a) and 2(b), connector element 60 in the form of a copper plug, passes from surface 44 to surface 46 and may preferably extend a small distance 61 beyond surfaces 44 and 46 to provide a better contact with the conductor elements in arrays 24 and 28. Also, body 42 has beveled surfaces 43 which make for easier insertion into slot 18. FIG. 2(c) is a cross section at plane 2C—2C which is a location on key 40 where a conductor element pair contact surfaces 44 and 46, but at which no electrical contact is desired. As can be seen, there is no conductive path between surfaces 44 and 46. Thus, in this location, key 40 electrically isolates the conductor element pair.

Figure 3:
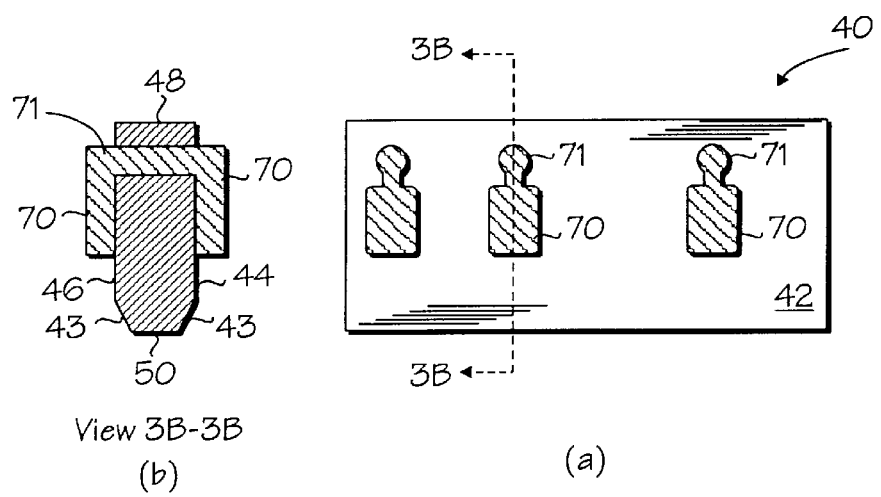
FIG. 3(a) is a front view of a key showing connector elements that uses via holes.
FIG. 3(b) is a cross sectional view of the key of FIG. 3(a) taken through plane 3B—3B.

FIGS. 3(a) and 3(b) illustrates an alternative connector element. Referring now to FIGS. 3(a) and 3(b), a conductive metal stripe 70 is deposited on surfaces 44 and 46 of body 42 which are connected by a conductive via 71 to provide a conductive path from surface 44 to surface 46. This embodiment makes use of standard industry printed circuit board techniques.

Figure 4:
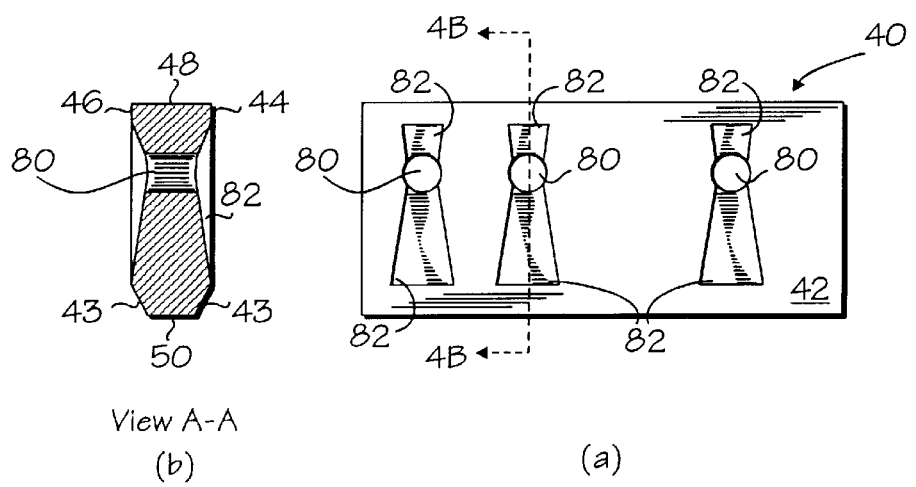
FIG. 4(a) is a front view of a key that has voids for allowing conductor elements to make contact.
FIG. 4(b) is a cross sectional view of the key of FIG. 4(a) through plane 4B—4B.

FIG. 4 illustrates another alternative embodiment for allowing electrical connection between a pair of conductor elements. FIG. 4(a) is a front view and FIG. 4(b) is a cross sectional view through plane 4B—4B. Referring now to FIGS. 4(a) and 4(b), voids or holes 80 are provided at the location on body 42 where electrical contact between the two conductor elements of a pair is desired. Areas 82 are tapered recesses in surfaces 44 and 46 on either side of voids 80 which guide conductor elements 24 and 28 to the voids 80 as key 40 is inserted into slot 18 of FIG. 1 and which allow for the bend in conductor elements 24 and 28 such that a solid contact is made. When key 40 is fully inserted into slot 18, a pair of conductor elements will make direct contact with each other through void area 80 without the aid of a third conductor element. However, in this embodiment, it is particularly important that conductor elements 24 and 28 be made from spring material and be mounted in housing 10 (FIG. 1) such that spring force causes a good electrical contact through void 80.

Figure 5:
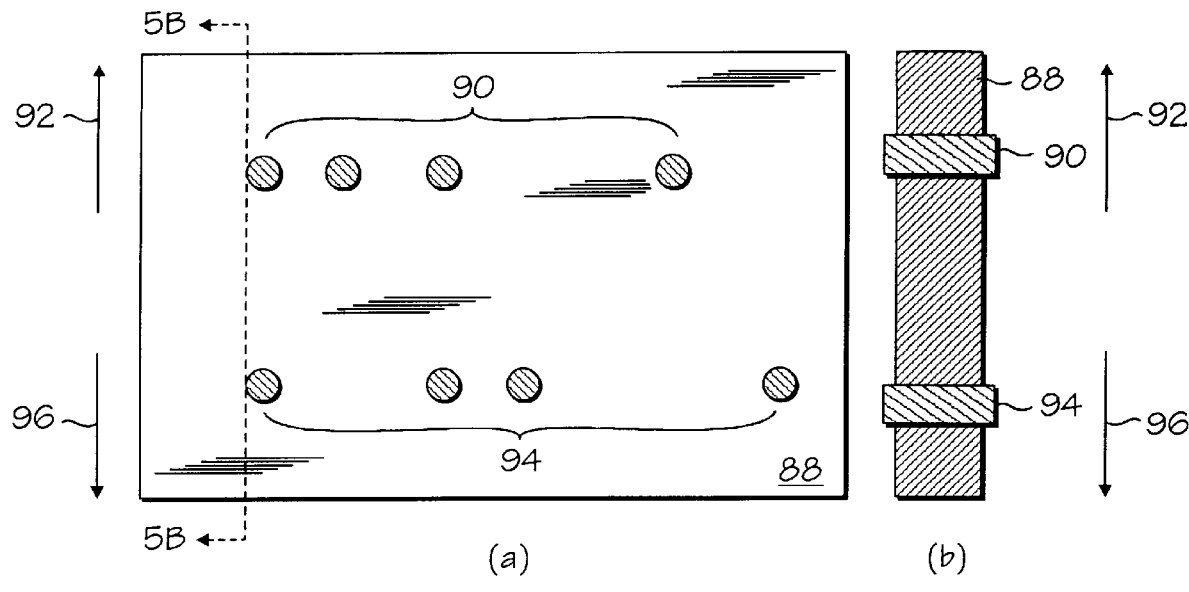
FIG. 5(a) is a front view of a double key using the copper plug embodiment for connector elements.
FIG. 5(b) is a cross sectional view through plane 5B—5B of FIG. 5(a).

The invention also contemplates a double sided key; that is, a key that has two independent and different combinations of connector elements or voids. The two different combinations create two different keys on the same body. The user may then choose either of the two keys to use by the direction in which he key is inserted. This may be useful for example when a computer is sold with a particular CPU but with an overdrive capability. Thus one key will be used with the original CPU and the other key with the overdrive CPU. FIG. 5 illustrates a double sided key using copper plug connectors. FIG. 5(a) is a front view and FIG. 5(b) is a cross sectional view through plane 5B—5B. Referring now to FIGS. 5(a) and 5(b), body 88 has a first set of connective elements 90 which will connect up a particular pattern of conductor elements 24 and 26 if the key is inserted in the direction indicated by arrow 92. Body 42 also has a second set of connective elements 94 which will connect up a different pattern of conductor elements 24 and 26 if the key is inserted in the direction indicated by arrow 96.

Figure 6:
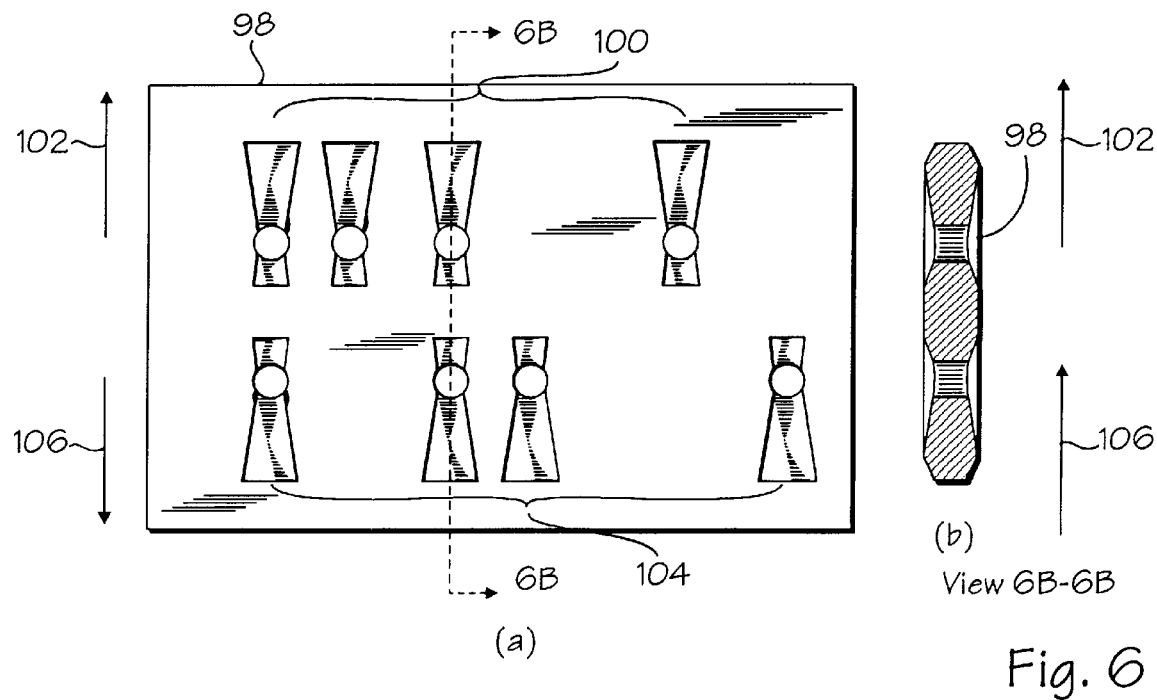
FIG. 6(a) is a front view of a double key using the voids embodiment.
FIG. 6(b) is a cross sectional view through plane 6B—6B of FIG. 6(a).

FIG. 6 illustrates a double sided key using voids to allow connection. FIG. 6(a) is a front view and FIG. 6(b) is a cross sectional view through plane 6B—6B. Referring now to FIGS. 6(a) and 6(b), body 42 has a first set of voids 100 which will connect up a particular pattern of conductor elements 24 and 26 if the key is inserted in the direction indicated by arrow 102. Body 98 also has a second set of voids 104 which will connect up a different pattern of conductor elements 24 and 26 if the key is inserted in the direction indicated by arrow 106.

A key activated switch matrix as described previously may be used to control access to the CMOS setup. That is, when a computer is booted up under DOS, a message appears such as "press F1 to enter setup". The setup mode allows one to set the hardware configuration of the system. Some systems manufacturers do not want their customers to have the ability to enter set up mode. Thus, it is possible to enable access to set up mode by use of a key, and a special key which could be carried by a field service technician and would be required to enter the set up mode.

It is also possible to control access to password setup by use of a key. That is, most computers have the ability to set two passwords: an administrator's password, and a user's password. The user's password locks out unauthorized would be users. The administrator's password restricts access to certain sections of CMOS and other hardware setups on the machine to which only configuration specialists should have access. In today systems, anyone can gain access by merely flipping dip switches or moving jumpers. The use of the key system of the present invention would solve this problem by requiring a would be user to insert the right key to access password setup. Another use for a key system is to tell the system whether there is audio capability on the mother board. Currently a hard wired resistor is used and it would be advantageous to ignore audio during system test. Yet another use for the key system is to enable/disable a universal serial bus (USB). For example if a system manufacturer put in a USB enable key, it would enable the USB port and disable the standard keyboard and mouse port. If the manufacturer put in the standard serial port key, it disables the USB port and enable the standard mouse, keyboard and serial ports. Video controller options and memory configurations could also be controlled by key. Also, the presence of a conventional mother board with several slots for add in board or a LPX type mother board with one master slot with a riser for the actual add in boards could be properly configured.

As can be seen, it would be possible to have several different keys for the same mother board, and each key would select a different subset of selectable parameters and would be used by different persons. This would reduce configuration errors introduced by human operators and would also allow control of levels of access to the system.

The preferred embodiments just described are subject to numerous adaptations and modifications without departing from the concept of the invention. Therefore, within the scope of the appended claims, the invention may be practiced other than as specifically described herein.

I claim:

1. An apparatus, comprising:

a computer mother board having a plurality of circuits;

a housing mounted on said mother board and containing a plurality of conductor element pairs, each conductor element pair being electrically connected to a corresponding one of said circuits and enabling said corresponding circuit when conductor elements of said conductor element pair are electrically coupled; and a key having a predetermined pattern of insulating portions and electrically conductive portions, said key being insertable into said housing such that said insulating portions and said electrically conductive portions make contact with said conductor element pairs, said key enabling predetermined circuits corresponding to conductor element pairs making contact with said electrically conductive portions and disabling other circuits corresponding to conductor element pairs making contact with said insulating portions when said key is inserted.

2. The apparatus of claim 1 wherein said key includes a first surface in contact with a first conductor element of each of said conductor element pairs when said key is inserted into said housing, said key having a second surface in contact with a second conductor element of each of said conductor element pairs when said key is inserted into said housing, said electrically conductive portions of said key electrically connecting said first conductor element with said second conductor element for predetermined ones of said conductor element pairs.

3. The apparatus of claim 1 wherein said electrically conductive portions are plated through holes.

4. The apparatus of claim 1 wherein said electrically conductive portions are electrically conductive strips running along the surface of said key from said first surface to said second surface.

5. The apparatus of claim 1 wherein said insulating portions are insulating material preventing electrical connection between said first conductor element and said second conductor element.

6. The apparatus of claim 1 wherein said conductor element pairs are spring loaded contacts.

7. An apparatus, comprising a housing mounted on a mother board having a plurality of circuits and containing a plurality of conductor element pairs, each conductor element pair being electrically connected to a corresponding one of said circuits and enabling said corresponding circuit when conductor elements of said conductor element pair are electrically coupled; and a key having a predetermined pattern of insulating portions and electrically conductive portions, said key being insertable into said housing such that said insulating portions and said electrically conductive portions make contact with said conductor element pairs, said key enabling predetermined circuits corresponding to conductor element pairs making contact with said electrically conductive portions and disabling other circuits corresponding to conductor element pairs making contact with said insulating portions when said key is inserted.

8. The apparatus of claim 7 wherein said key includes a first surface in contact with a first conductor element of each of said conductor element pairs when said key is inserted into said housing, said key having a second surface in contact with a second conductor element of each of said conductor element pairs when said key is inserted into said housing, said electrically conductive portions of said key electrically connecting said first conductor element with said second conductor element for predetermined ones of said conductor element pairs.

9. The apparatus of claim 7 wherein said electrically conductive portions are plated through holes.

10. The apparatus of claim 7 wherein said electrically conductive portions are electrically conductive strips running along the surface of said key from said first surface to said second surface.

11. The apparatus of claim 7 wherein said insulating portions are insulating material preventing electrical connection between said first conductor element and said second conductor element.

12. The apparatus of claim 7 wherein said conductor element pairs are spring loaded contacts.

13. An apparatus, comprising a means for housing mounted on a mother board having a plurality of circuits and containing a plurality of conductor element pairs, each conductor element pair being electrically connected to a corresponding one of said circuits and enabling said corresponding circuit when conductor elements of said conductor element pair are electrically coupled; and a means for keying having a predetermined pattern of insulating portions and electrically conductive portions, said means for keying being insertable into said means for housing such that said insulating portions and said electrically conductive portions make contact with said conductor element pairs, said means for keying enabling predetermined circuits corresponding to conductor element pairs making contact with said electrically conductive portions and disabling other circuits corresponding to conductor element pairs making contact with said insulating portions when said means for keying is inserted.

14. The apparatus of claim 13 wherein said means for keying includes a first surface in contact with a first conductor element of each of said conductor element pairs when said means for keying is inserted into said means for housing, said means for keying having a second surface in contact with a second conductor element of each of said conductor element pairs when said means for keying is inserted into said means for housing, said electrically conductive portions of said means for keying electrically connecting said first conductor element with said second conductor element for predetermined ones of the said conductor element pairs.

15. The apparatus of claim 13 wherein said electrically conductive portions are plated through holes.

16. The apparatus of claim 13 wherein said electrically conductive portions are electrically conductive strips running along the surface of said means for keying from said first surface to said second surface.

17. The apparatus of claim 13 wherein said insulating portions are insulating material preventing electrical connection between said first conductor element and said second conductor element.

18. The apparatus of claim 13 wherein said conductor element pairs are spring loaded contacts.

* * * * *

UNITED STATES PATENT AND TRADEMARK OFFICE
CERTIFICATE OF CORRECTION

PATENT NO.    : 5,952,632
DATED         : September 14, 1999
INVENTOR(S)   : Irvine It is certified that error appears in the above-identified patent and that said Letters Patent is hereby corrected as shown below:

Column 2,
Line 27, after "conductor pairs", insert -- mounted on a mother board --.

Column 5,
Line 14, delete "today", insert -- today's --.

Signed and Sealed this

Fourth Day of November, 2003

JAMES E. ROGAN
*Director of the United States Patent and Trademark Office*